(12) United States Patent
Buck

(10) Patent No.: US 6,596,444 B2
(45) Date of Patent: Jul. 22, 2003

(54) PHOTOMASK AND METHOD FOR CORRECTING FEATURE SIZE ERRORS ON THE SAME

(75) Inventor: Peter Buck, Aloha, OR (US)

(73) Assignee: DuPont Photomasks, Inc., Round Rock, TX (US)

(*) Notice: Subject to any disclaimer, the term of this patent is extended or adjusted under 35 U.S.C. 154(b) by 100 days.

(21) Appl. No.: 09/854,284

(22) Filed: May 10, 2001

(65) Prior Publication Data

US 2002/0076624 A1 Jun. 20, 2002

Related U.S. Application Data

(60) Provisional application No. 60/256,151, filed on Dec. 15, 2000.

(51) Int. Cl.[7] .............................. G03F 7/00; G03F 9/00; G06F 7/60
(52) U.S. Cl. ................................ 430/5; 430/30; 716/19; 716/20; 716/21
(58) Field of Search ........................ 430/5, 30; 716/19, 716/20, 21

(56) References Cited

U.S. PATENT DOCUMENTS

| | | | |
|---|---|---|---|
| 4,463,265 A | 7/1984 | Owen et al. | 250/492.2 |
| 4,520,269 A | 5/1985 | Jones | 250/492.2 |
| 5,051,598 A | 9/1991 | Ashton et al. | 250/492.2 |
| 5,208,124 A | 5/1993 | Sporon-Fiedler et al. | 430/5 |
| 5,241,185 A | 8/1993 | Meiri et al. | 250/492.2 |
| 5,242,770 A | 9/1993 | Chen et al. | 430/5 |
| 5,254,438 A | 10/1993 | Owen et al. | 430/296 |
| 5,278,105 A | 1/1994 | Eden et al. | 437/250 |
| 5,657,235 A | 8/1997 | Liebmann et al. | 364/474.24 |
| 5,707,765 A | 1/1998 | Chen | 430/5 |
| 5,725,974 A | 3/1998 | Kawahira | 430/5 |
| 5,804,339 A | 9/1998 | Kim | 430/5 |
| 5,867,253 A | 2/1999 | Nakae | 355/52 |
| 5,899,706 A | 5/1999 | Kluwe et al. | 438/139 |
| 6,044,007 A * | 3/2000 | Capodieci | 430/5 |
| 6,051,347 A | 4/2000 | Tzu et al. | 430/30 |
| 6,137,901 A * | 10/2000 | Harazaki | 430/5 |
| 6,168,891 B1 * | 1/2001 | Shibata | 430/30 |
| 6,243,855 B1 * | 6/2001 | Kobayashi et al. | 716/19 |
| 6,249,904 B1 * | 6/2001 | Cobb | 716/21 |

OTHER PUBLICATIONS

Otto and co–w. "Automated optical proximity correction—a rule–based approach", SPIE v.2197, 1994, p 278–293.*

"Studies of The Molecular Mechanism of Dissolution Inhibition of Positive Photoresist Based on Novolak–DNQ" by Honda, et al., Olin Hunt Specialty Products Inc., *SPI vol. 1262 Advances in resist Technology and Processing VII*, 1990.

"Novolak Design for High Resolution Positive Photresists (II): Stone Wall Model for Positive Photoresist Development" by Hanabata, et al., Sumitomo Chemical Col, Ltd. Research Labaoratory, Osaka, Japan, *SPIE vol. 920 Advances in resist Technology and Processing V*, 1998.

"Mask Patterns Correction for Advanced Device" Watanabe, et al, Photomask and next–Generation Lithography mask Technology VII, Proceedings of SPIE vol. 4966, 2000.

"Improvements to Mask Inspectability by Use of Pattern Proximity Correction" Rosenbusch, et al., in 16th European Conference on Mask Technology for Integrated Circuits and Microcomponents, Proceedings of SPIE vol. 3996, 2000.

"Assessment of corner rounding improvement by automatic software correction on laser pattern generator manufactured photomasks" Ziegler, et al., BACUS Symposium on Photomask Technology and Management, Redwood City, California. SPIE vol. 3546, Sep. 1998.

* cited by examiner

Primary Examiner—Mark F. Huff
Assistant Examiner—Kripa Sagar
(74) Attorney, Agent, or Firm—Baker Botts L.L.P.

(57) ABSTRACT

A method for correcting pattern errors on a photomask is disclosed. The method includes determining a proximity effect caused by a first feature on a second feature in a pattern data file. The total line edge length is calculated for the first feature and a dimension of the second feature is modified based on the total line edge length calculated or the first feature.

26 Claims, 3 Drawing Sheets

PHOTOMASK AND METHOD FOR CORRECTING FEATURE SIZE ERRORS ON THE SAME

CROSS REFERENCE TO RELATED APPLICATION

This application claims priority from U.S. Provisional Patent Application Ser. No. 60/256,151, filed Dec. 15, 2000, and entitled "Photomask Iso-Dense Bias Compensation Scheme"

TECHNICAL FIELD OF THE INVENTION

This invention relates in general to the field of photolithography and, more particularly, to a method for correcting pattern errors on a photomask.

BACKGROUND OF THE INVENTION

As feature sizes for integrated circuits (ICs) decrease, semiconductor manufacturers face new challenges controlling feature sizes during processing. Processing steps that can affect feature size control include lithography, resist development and etching. The industry currently uses many different techniques to control feature size on a wafer. For example, optical proximity correction (OPC) of the pattern on a photomask can improve the feature size control during lithography, while chemical mechanical polishing (CMP) can improve control after etching is completed.

A photolithography system typically uses a photomask, also known as a reticle or mask, to transfer a pattern representing an IC onto a semiconductor wafer. The photomask is formed from a photomask blank by using a standard photolithography process, such as laser or electron beam lithography. During the lithography process, optical proximity effects may produce variations in the dimensions of a feature as a function of the proximity of other nearby features. A common optical proximity effect, known as iso-dense bias, creates a difference between the printed dimensions of an isolated feature and a dense feature having the same design dimensions.

Semiconductor manufacturers typically attempt to correct iso-dense bias on the wafer by correcting the pattern on the photomask. For example, U.S. Pat. No. 5,208,124 issued to Sporon-Fiedler, et al., discloses a technique for modifying a photomask pattern based on one or more equations that define the deviation of a wafer image from the pattern in a design data file. In this case, iso-dense bias is corrected by adjusting the feature sizes on the photomask based on line width and pitch. Also, U.S. Pat. No. 5,867,253 issued to Nakae discloses a method of determining the local pattern density within a certain radius of a design point and comparing it to a reference pattern density in order to determine if correction is required. Semiconductor manufacturers also may correct proximity effects on the wafer by changing the exposure dose for features in isolated and dense areas. For example, U.S. Pat. No. 5,657,235 issued to Liebmann, et al. discloses a method of creating pattern data with relative dose information. Feature sizes and shapes on a wafer are modified by assigning exposure doses for each feature, rather than physically manipulating the feature sizes on the mask. These techniques reduce iso-dense bias on the wafer but fail to solve the iso-dense bias effect produced during fabrication of the photomask.

SUMMARY OF THE INVENTION

In accordance with the teachings of the present invention, disadvantages and problems associated with correcting pattern errors on a photomask have been substantially reduced or eliminated. In a particular embodiment, a method for correcting feature size errors on a photomask is disclosed that modifies a dimension of a second feature based on a calculated total line edge length for a first feature.

In accordance with one embodiment of the present invention, a method for correcting pattern errors on a photomask includes determining a proximity effect caused by a first feature on a second feature in a pattern data file. The method calculates a total line edge length for the first feature and modifies a dimension of the second feature based on the total line edge length calculated for the first feature.

In accordance with another embodiment of the present invention, a method for fabricating a photomask includes determining a proximity effect caused by one or more first features on a second feature in a first pattern data file. The method calculates a total line edge length by summing edge lengths of the one or more first features and modifies an edge position of the second feature based on the total line edge length calculated for the one or more first features. The method further generates a second pattern data file including the one or more first features and the modified second feature. A photoresist layer of a photomask blank is patterned using the second pattern data file to form one or more first regions and a second region in an opaque layer that are respectively substantially equal in size to the one or more features and the second feature in the first pattern data file.

In accordance with a further embodiment of the present invention, a photomask includes a patterned opaque layer formed on a transparent substrate. The opaque layer is generated with a modified pattern file that includes data representing a first feature and a second feature modified based on a total line edge length of the first feature.

Important technical advantages of certain embodiments of the present invention include a photolithography technique that corrects iso-dense bias effects on a photomask. Most semiconductor manufacturers ignore errors on the photomask caused by iso-dense bias when manufacturing the photomask. Traditionally, manufacturers compensate for the iso-dense bias effect on the photomask indirectly by compensating the mask pattern for iso-dense bias on the wafer. This method is usually not sufficient to completely compensate for the photomask iso-dense bias effects that occur on the wafer. The present invention provides a method for directly compensating for iso-dense bias on the photomask by modifying dense features in a pattern data file and fabricating the photomask with the modified features.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION

Preferred embodiments of the present invention and their advantages are best understood by reference to FIGS. 1 through 6, where like numbers are used to indicate like and corresponding parts.

A photomask is a crucial component of a photolithography system because it serves as the template that images a complex geometry, such as an integrated circuit (IC), on a wafer. Design requirements for ICs continue to tighten and it is necessary to reduce or even eliminate dimension errors caused by optical proximity effects. Conventional techniques primarily focus on reducing optical proximity effects, such as iso-dense bias, during fabrication of a wafer but fail to address proximity effects that occur during fabrication of a photomask. In a particular embodiment, the present invention provides a method for correcting iso-dense bias for a selected feature on a photomask by calculating a total line edge length for surrounding features within a specific radius of the selected feature.

Figure 1:
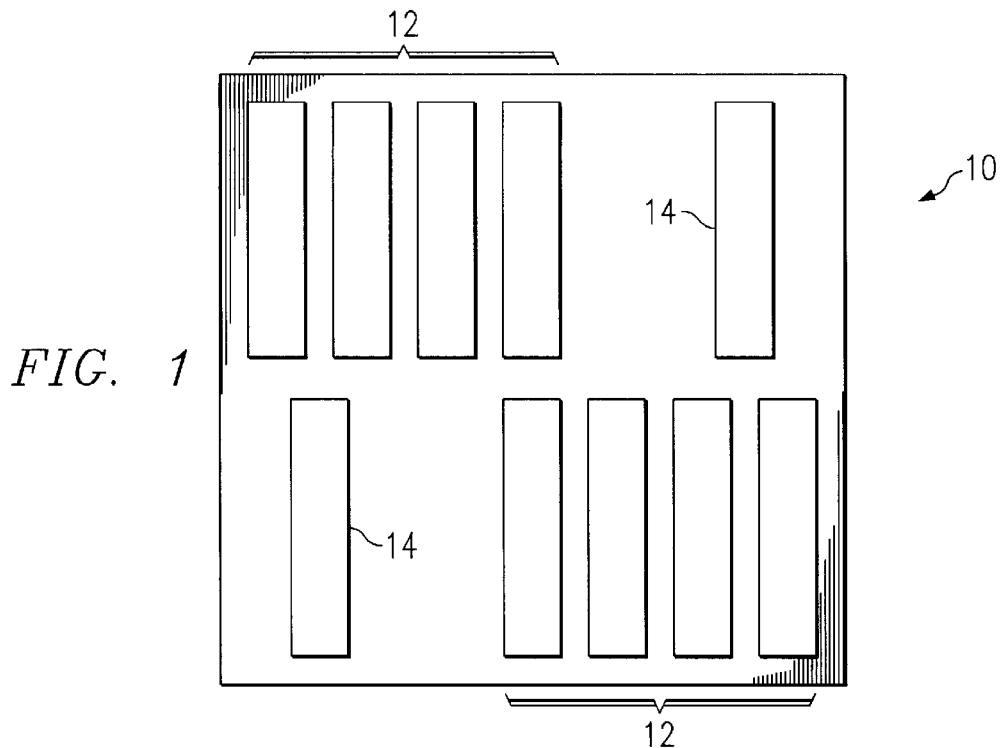
FIG. 1 illustrates a top view of a photomask according to the teachings of the present invention.

FIG. 1 illustrates a top view of a conventional photomask. Photomask 10 includes a pattern with dense features 12 and isolated features 14. Photomask 10 may be formed from a photomask blank using a standard photolithography process. In the lithography process, an original photomask pattern data file is generated from a circuit design pattern and the desired pattern is imaged on the photomask blank using a laser or electron beam photolithography system. In one embodiment, the photolithography system uses an Argon-Ion laser that emits light having a wavelength of approximately 364 nanometers (nm). In alternative embodiments, the photolithography system uses lasers emitting light at wavelengths from approximately 150 nm to approximately 300 nm. Photomask 10 is fabricated by developing the exposed areas of a photoresist layer on the photomask blank to create a pattern, etching the regions of an opaque layer not covered by photoresist, and removing the undeveloped photoresist to create a patterned opaque layer over a transparent substrate.

During lithography, pattern design errors may occur due to optical proximity effects. One example of an optical proximity effect is iso-dense bias, which causes dense features 12 on photomask 10 to have different printed widths than isolated features 14, even though the design widths of dense features 12 and isolated features 14 in the original pattern data file are equal. One probable cause of the iso-dense bias effect on a photomask may be dissolution inhibition due to azo-coupling (also known as the red-cloud effect), which is described in Honda et al., "Studies of The Molecular Mechanism of Dissolution Inhibition of Positive Photoresist Based on Novolak-DNQ," SPIE Vol. 1262, pages 493–500, 1990 and Hanabata et al., "Novolak Design for High Resolution Positive Photoresists (II): Stone Wall Model for Positive Photoresist Development," SPIE Vol. 920, pages 349–354, 1988, and incorporated herein by reference. For example, photomask 10 may be fabricated in a laser-based photolithography system using a novolak resist combined with a diazo-napthaquinone (DNQ) inhibitor. The DNQ inhibitor causes the dissolution rate of the novolak resin in a developer (e.g., a basic solution) to decrease. Exposure to ultra-violet light causes the DNQ to be transformed into a weak acid, which has the effect of increasing the dissolution rate of the novolak resin in the exposed areas. When the resist is placed in the developer, the exposed regions of the resist dissolve much faster than the unexposed regions and form a pattern in the photoresist layer on photomask 10.

However, due to azo-coupling, some of the DNQ in the exposed regions may remain unconverted. The unconverted DNQ may be released into the developer where it reacts and forms a compound that acts as a dissolution inhibitor. The varying local concentrations of the DNQ compound creates localized inhibition that ultimately affects the developed pattern size. The amount of DNQ released into the developer may be a function of the edge length of the exposed areas since the edges of the exposed area represent the region where the DNQ concentration reaches a development threshold. Fresh developer may dilute the concentration of the compound and over a large enough distance, the compound may have no effect. Isolated features 14, therefore, may not be affected by the compound since more fresh developer may be present around isolated features 14. Some dense features 12 may also not be affected if the dimensions of the feature are sufficiently large. In this case, only dense features 12 that have a width below a specific dimension, e.g., twice the minimum feature size of the specific process, may be selected for modification. In this example, dense features 12 that have a width above the specific dimension remain unmodified in a modified photomask pattern data file. In an alternative embodiment, all dense features 12 may be selected for modification.

Figure 2:
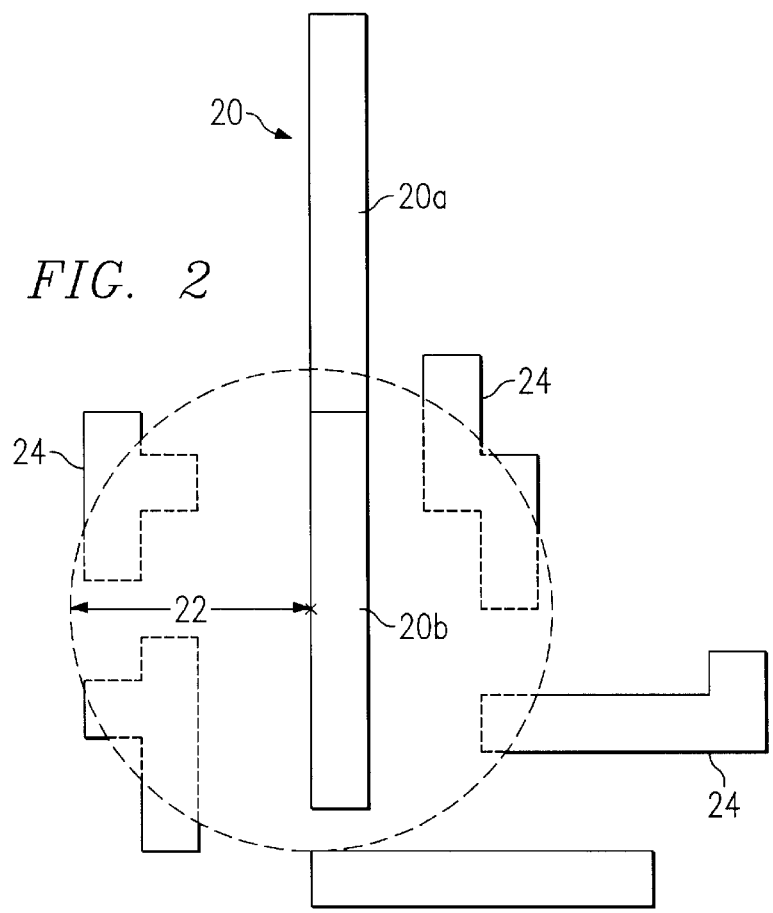
FIG. 2 illustrates a diagram of a selected feature and surrounding features in an original photomask pattern data file according to the teachings of the present invention.

FIG. 2 illustrates a diagram of selected feature 20 and surrounding features 24 in an original photomask pattern data file. The original pattern data file is created by converting a circuit design file provided by a semiconductor manufacturer. Surrounding features 24 have a proximity effect, such as iso-dense bias, on selected feature 20. The proximity effect may be calculated by choosing a point along one or more of the edges of selected feature 20. In one embodiment, a point is selected on each edge of selected feature 20 if selected feature 20 has surrounding features 24 on all sides. In another embodiment, selected feature 20 is adjacent to an isolated area and the edge of selected feature 20 closest to the isolated area may not need modification since the isolated area contains no surrounding features 24. Therefore, only the edges of selected feature 20 adjacent to surrounding features 24 are modified.

For each point selected on each edge of selected feature 20, a circle with radius 22 may be drawn using the point (as illustrated by an X in FIG. 2) as the center. Radius 22 may be determined based on the type of photoresist layer formed on the photomask blank, the lithography process used to manufacture photomask 10, or any other measure that may affect feature size on the mask. In one embodiment, radius 22 is between approximately one micron (1 $\mu$m) and approximately fifty microns (50 $\mu$m). The proximity effect on selected feature 20 is calculated by summing the edge lengths of surrounding features 24 that fall within the circle. This total edge length is used to adjust the appropriate edge position of selected feature 20.

In an alternative embodiment, the edges of selected feature 20 may be divided into multiple segments. As illustrated in FIG. 2, selected feature 20 passes through isolated and dense areas of the pattern. In one embodiment, selected feature 20 may be divided into two equal segments, isolated segment 20a and dense segment 20b, that respectively pass through the isolated and dense areas of the pattern. Since isolated segment 20a has no surrounding features 24, a proximity effect may not be calculated and isolated segments 20a may remain unmodified. Dense segment 20b, however, may require modification due to the proximity effect caused by surrounding features 24. As described above, a point on dense segment 20b is selected to perform the proximity effect calculation. A circle with radius 22 may be drawn from the point on dense segment 20b and the edge lengths of surrounding features 24 within radius 22 may be added together to obtain the total line edge length.

In an another embodiment, dense segment 20b may be further divided into multiple segments having equal lengths to obtain a precise measure of the proximity effect on selected feature 20. A point is selected on each of the segments and a circle having radius 22 drawn around the selected points. The proximity calculation is performed for each individual segment until all segments of dense segment 20b have been adjusted by the appropriate amount.

Figure 3:
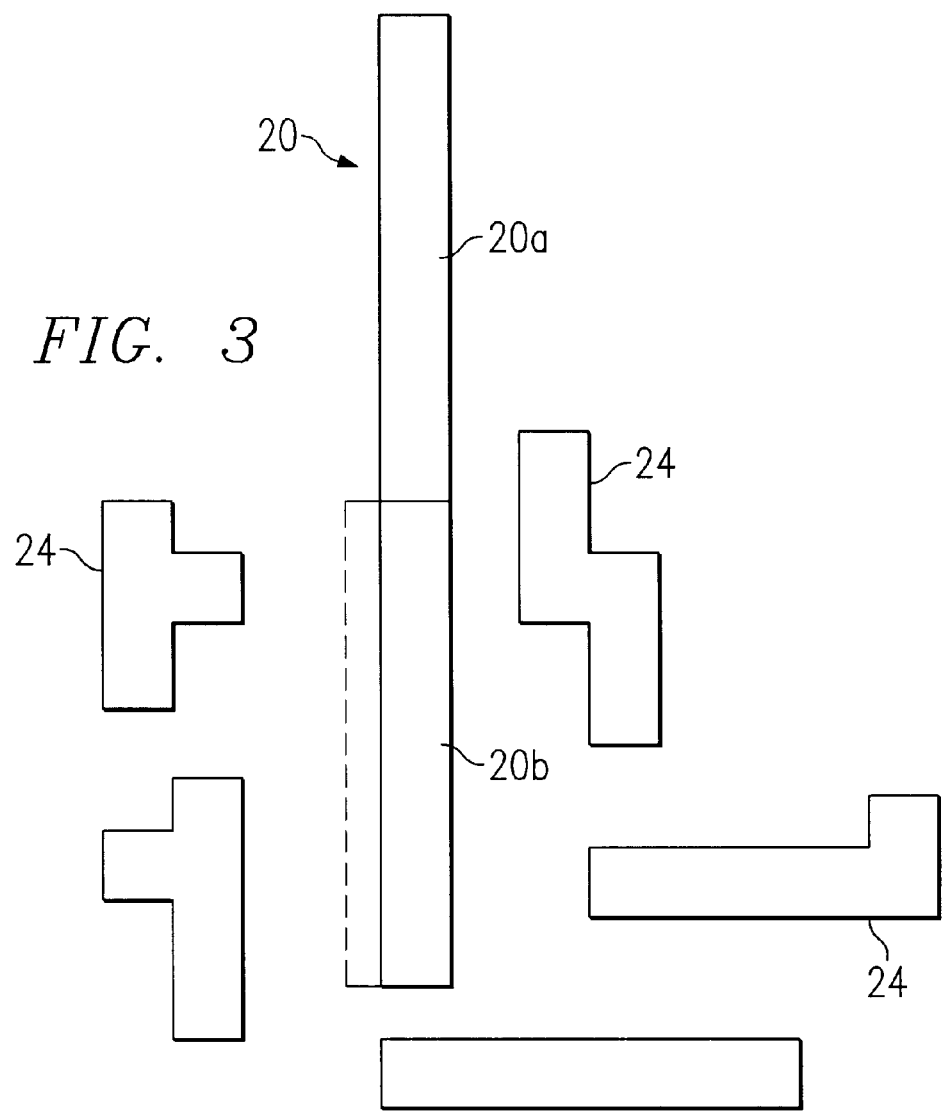
FIG. 3 illustrates a diagram of the desired edge position of the selected features in the original photomask pattern data file and the actual edge position of the selected feature in a modified photomask pattern data file.

FIG. 3 illustrates a diagram of the desired edge position of selected feature 20 in an original photomask pattern data file and the actual edge position of selected feature 20 in a modified photomask pattern data file. Once the modifications to selected feature 20 have been calculated, a modified photomask pattern data file is generated. The modified pattern data file contains the pattern to be imaged onto photomask 10 and includes modified edge positions for selected feature 20. As illustrated by the dotted line in FIG. 3, the dimensions of dense segment 20b of selected feature 20 are adjusted in the modified pattern data file. A laser or electron beam photolithography system uses the modified pattern data file to image the pattern onto a photomask blank. The resulting photomask contains the pattern with features that have printed dimensions that are approximately equal to the desired dimensions in the original pattern data file (as represented by the solid line of dense segment 20b in FIG. 3). Since the patterns printed on wafers are only as good as the photomask used to print them, correcting iso-dense bias on photomask 10 may allow semiconductor manufacturers to correct iso-dense bias on the wafer without modifying the wafer fabrication process.

Figure 4:
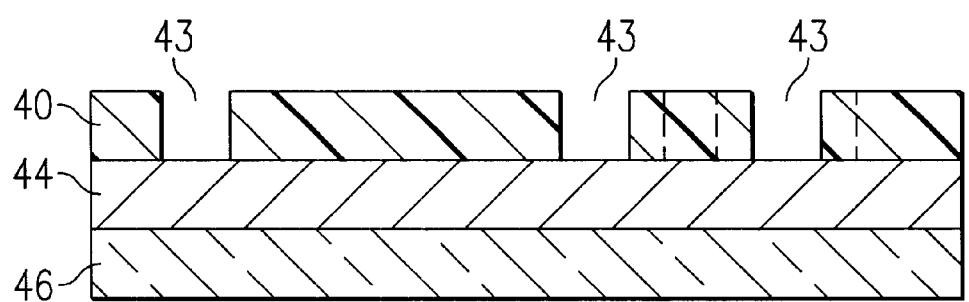
FIG. 4 illustrates a cross-sectional view of a photomask blank including a patterned photoresist layer with and without adjustments for proximity effects.

FIG. 4 illustrates a cross-sectional view of photomask 10 including patterned photoresist layer 40 with and without an adjustment for the proximity effect. Photomask 10 includes photoresist layer 40, opaque layer 44 and transparent substrate 46. Opaque layer 44 may be chrome, chromium nitride, a metallic oxy-carbo-nitride, e.g., MOCN where M is selected from the group consisting of chromium, cobalt iron, zinc, molybdenum, niobium, tantalum, titanium, tungsten, aluminum, magnesium and silicon, molybdenum silicide and any other suitable material that absorbs light with wavelengths between approximately 150 nm and approximately 450 nm. In an alternative embodiment, opaque layer 44 may be molybdenum silicide (MoSi), which has a transmissivity of approximately one to thirty percent. Transparent substrate 46 may be synthetic quartz, fused silica, magnesium fluoride, calcium fluoride, or any other suitable material that transmits approximately ninety-nine percent of incident light having a wavelength between approximately 150 nm and 450 nm.

In a positive resist process, areas 43 of photoresist layer 40 are exposed by light from a photolithography system and are dissolved in the developer to expose regions of opaque layer 44 formed on transparent substrate 46. As described above in reference to azo-coupling, unconverted DNQ near the edges of areas 43 of photoresist layer 40 acts as a dissolution inhibitor. As illustrated by the solid line in FIG. 4, areas 43 in photoresist layer 40 have smaller dimensions than the feature in the original pattern data file. Therefore, to produce areas 43 with the correct dimensions, as illustrated by the dotted line in FIG. 4, the associated features in the modified pattern data file should be increased in size from the corresponding features in the original pattern data file.

In a negative resist process, areas 43 of photoresist layer 40 are not exposed to light from the photolithography system and are dissolved in the developer to expose regions of opaque layer 44 formed on transparent substrate 46. Dissolution of the photoresist may be inhibited along the edges of areas 43 and, as illustrated by the solid line in FIG. 4, produce areas 43 in photoresist layer 40 that have larger dimensions. Therefore, to produce areas 43 with the correct dimensions, as illustrated by the dotted line in FIG. 4, the associated features in the modified pattern data file should be decreased in size from the corresponding features in the original pattern data file.

Figure 5:
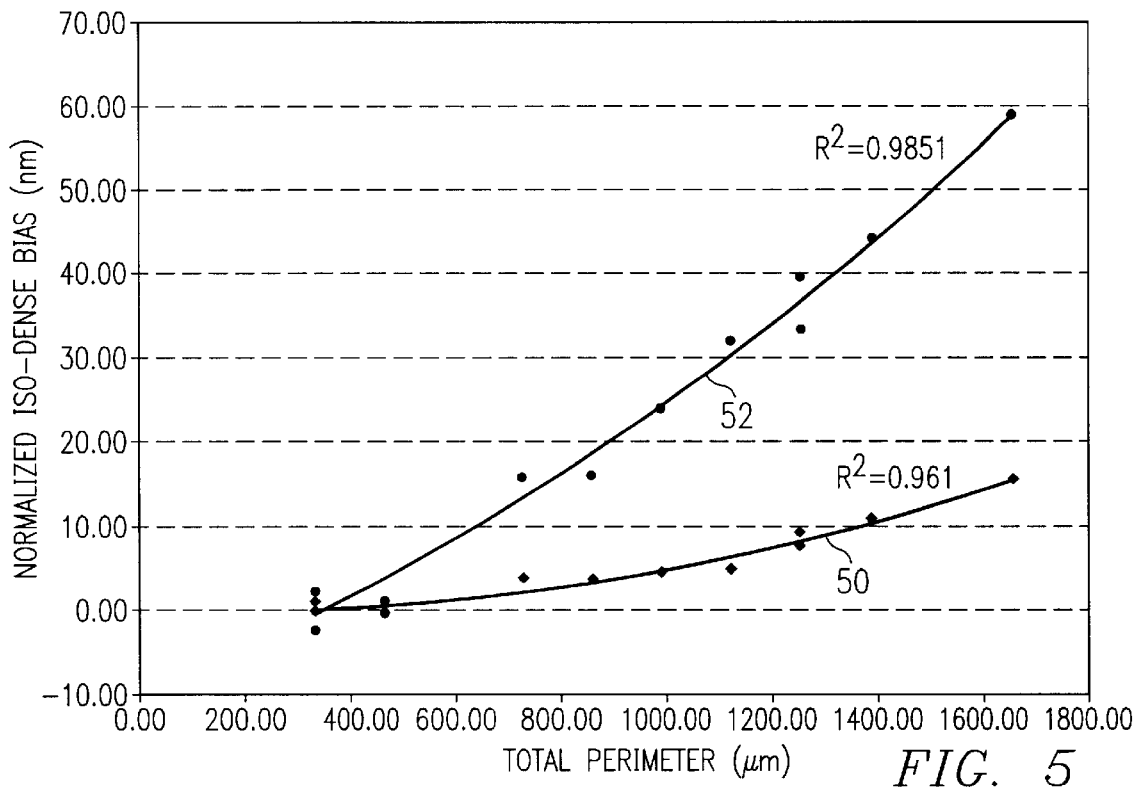
FIG. 5 illustrates a graph of the functional relationship between iso-dense bias on the photomask and a calculated edge perimeter length for two different types of photoresist.

FIG. 5 illustrates a graph of the functional relationship between the amount of iso-dense bias on photomask 10 and the calculated total line edge length for two different types of photoresists. The graph was generated by testing ARCH 895i produced by ARCH, represented by line 50 and TOK THMR-iP3600 produced by Tokyo Ohka Kogyo, represented by line 52. In the illustrated embodiment, radius 22 has a value of approximately fifteen microns (15 $\mu$m) for each type of photoresist. In other embodiments, radius 22 may be determined for each resist by generating test patterns and determining the value where increasing the radius stops correcting for the proximity effect.

As illustrated by the graph, the amount of iso-dense bias on photomask 10 increases as the total line edge length of surrounding features 24 also increases. For any given total edge length, the appropriate edge position is adjusted by an amount corresponding to the iso-dense bias caused by surrounding features 24. As described above, to correct iso-dense bias for a positive resist, the width of selected feature 20 in a modified photomask pattern data file should be increased.

Figure 6:
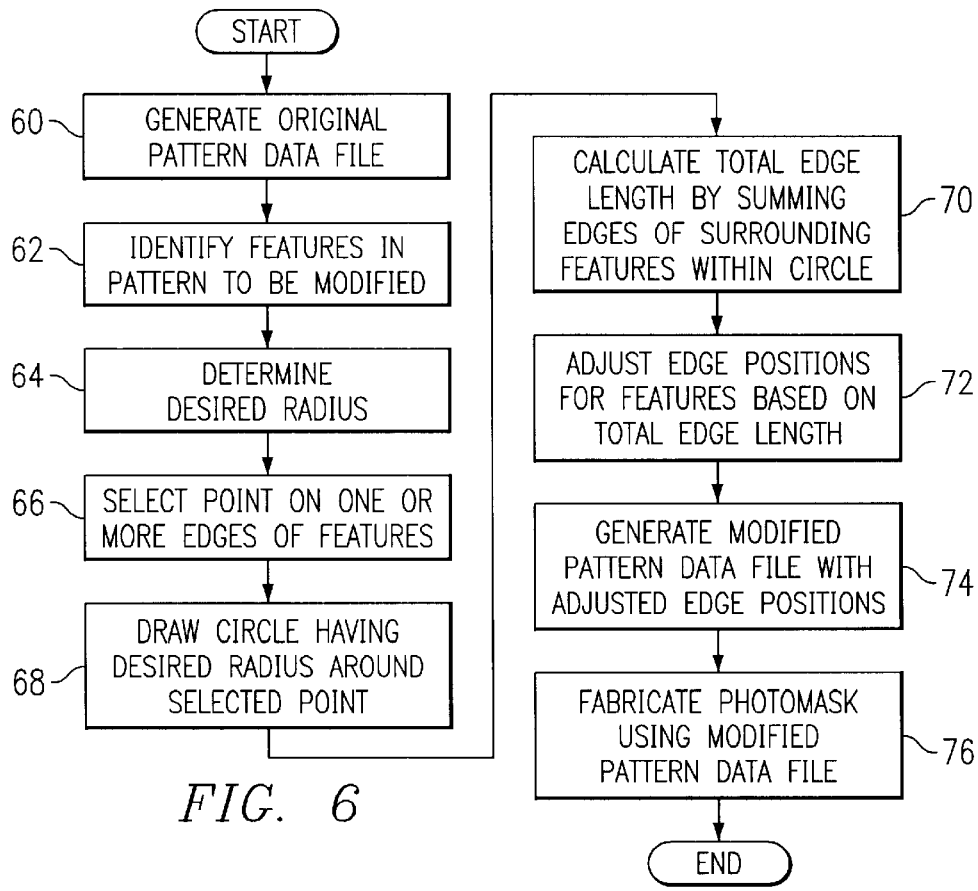
FIG. 6 illustrates a flow diagram of a method for correcting pattern errors on a photomask according to the teachings of the present invention.

FIG. 6 illustrates a flow diagram of a method for correcting feature size errors on photomask 10. At step 60, a circuit design data file provided by a semiconductor manufacturer is converted into an original photomask pattern data file that may be used in a laser or electron beam photolithography system to form photomask 10. Selected feature 20, such as the gate of a semiconductor device, may be identified for modification due to proximity effects caused by surrounding features 24 at step 62. In one embodiment, only specific features, e.g., dense features 12 that have dimensions below a specific dimension, are selected for modification. In an alternative embodiment, all dense features 12 may be individually selected for modification. In either embodiment, a proximity calculation is performed using the steps discussed below for each selected feature 20 until all selected features have been modified.

At step 64, radius 22 is determined and operates to identify surrounding features 24 that contribute to a proximity effect on selected feature 20. In one embodiment, radius 22 may be determined based on the type of photoresist used to create the pattern on photomask 10. Once radius 22 is determined, a point on one of the edges of selected feature 20 is chosen at step 66. In one embodiment, a point may be selected on each edge of selected feature 20. In another embodiment, each edge of selected feature 20 may be divided into two or more equal segments to obtain a more precise measurement of the proximity effect on selected feature 20. A point may be chosen on each of the segments in order to calculate the proximity effect for the individual segments. The proximity effect caused by the surrounding features may then be calculated for each segment of the selected feature until the entire selected feature has been modified.

At step 68, a circle having radius 22 is drawn around the point along the edge of selected feature 20. The sections of surrounding features 24 within the circle have a proximity effect on selected feature 20. A total edge length, which corresponds to the proximity effect of surrounding features 24 on selected feature 20, may be calculated by summing the edge lengths of surrounding features 24 that are located within the circle at step 70. The edge position of selected feature 20 is adjusted based on the total edge length at step 72. In one embodiment, a positive photoresist is used and the edge position of selected feature 20 is adjusted so that the dimensions are increased in the modified pattern data file relative to the original pattern data file. In an alternative embodiment, a negative photoresist is used and the edge position of selected feature 20 is adjusted so that the dimensions are decreased in the modified pattern data file relative to the original pattern data file. The total calculated edge length for the surrounding features is then used to modify the selected feature at step 72.

At step 74, a modified photomask pattern data file is generated that includes surrounding features 24 and the adjusted edge positions for each selected feature 20. The modified pattern data file is used in a photolithography system to image the pattern onto photomask 10 at step 76.

Although the present invention has been described in detail, it should be understood that various changes, substitutions, and alterations can be made without departing from the spirit and scope of the invention as defined by the appended claims.

What is claimed is:

1. A method for correcting pattern errors on a photomask, comprising:
   determining a proximity effect caused by a first feature on a second feature in a first pattern data file; calculating a total line edge length for the first feature; and
   modifying a dimension of the second feature based on the total line edge length calculated for the first feature.

2. The method of claim 1, further comprising generating a second pattern data file comprising the first feature and the modified second feature.

3. The method of claim 2, further comprising fabricating a photomask with the second pattern data file to form a first region and a second region in an opaque layer that are respectively approximately equal in size to the first feature and the second feature in the first pattern data file.

4. The method of claim 1, further comprising identifying the first feature within a predetermined radius from the second feature.

5. The method of claim 4, wherein the radius is between approximately one microns and approximately fifty microns.

6. The method of claim 4, wherein the calculating comprises summing edge lengths of the first feature located within the radius.

7. The method of claim 1, wherein the dimension comprises a line edge position.

8. The method of claim 1, wherein the proximity effect comprises an iso-dense bias influence.

9. The method of claim 1, wherein the first feature comprises a plurality of first features.

10. The method of claim 1, further comprising:
    dividing the second feature into one or more segments; and
    modifying the one or more segments based on the total line edge calculated for the first feature.

11. A method for fabricating a photomask, comprising:
    determining a proximity effect caused by one or more first features on a second feature in a first pattern data file;
    calculating a total line edge length by summing edge lengths of the one or more first features;
    modifying an edge position of the second feature based on the total line edge length calculated for the one or more first features;
    generating a second pattern data file including the one or more first features and the modified second feature; and
    patterning a photoresist layer of a photomask blank using the second pattern data file to form one or more first regions and a second region in an opaque layer that are respectively approximately equal in size to the one or more first features and the second feature in the first pattern data file.

12. The method of claim 11, further comprising etching the one or more first regions and the second region of the opaque layer to form a photomask.

13. The method of claim 11, further comprising identifying the one or more first features within a predetermined radius from the second feature.

14. The method of claim 13, further comprising determining the radius based on the photoresist layer.

15. The method of claim 11, wherein the proximity effect comprises an iso-dense bias influence.

16. The method of claim 11, wherein the photoresist layer comprises a positive photoresist.

17. The method of claim 11, wherein the photoresist layer comprises a negative photoresist.

18. A photomask comprising:
    a transparent substrate; and
    a patterned opaque layer disposed on the transparent substrate, the opaque layer generated with a modified pattern file including data representing a first feature and a second feature modified based on a total line edge length of the first feature.

19. The photomask of claim 18, wherein the first feature has an iso-dense bias influence on the second feature.

20. The photomask of claim 18, further comprising the first feature located within a predetermined radius of the second feature.

21. The photomask of claim 20, further comprising the total line edge length calculated by summing up edge lengths of the first feature located within the radius.

22. The photomask of claim 18, further comprising the data in the modified pattern file derived from an original pattern file including data representing the first and second features.

23. The photomask of claim 22, further comprising the opaque layer including a first region and a second respectively approximately equal in size to the first feature and the second feature in the original pattern file.

24. The photomask of claim 18, wherein the first feature comprises a plurality of first features.

25. The photomask of claim 18, wherein the transparent substrate comprises synthesized quartz.

26. The photomask of claim 18, wherein the opaque layer comprises chrome or chromium nitride.

* * * * *